(12) United States Patent
Seo et al.

(10) Patent No.: US 10,693,059 B2
(45) Date of Patent: Jun. 23, 2020

(54) MTJ STACK ETCH USING IBE TO ACHIEVE VERTICAL PROFILE

(71) Applicant: International Business Machines Corporation, Armonk, NY (US)

(72) Inventors: Soon-Cheon Seo, Glenmont, NY (US); Kisup Chung, Slingerlands, NY (US); Injo Ok, Loudonville, NY (US); Seyoung Kim, White Plains, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/899,933

(22) Filed: Feb. 20, 2018

(65) Prior Publication Data

US 2019/0259939 A1  Aug. 22, 2019

(51) Int. Cl.
| | |
|---|---|
| *H01L 27/00* | (2006.01) |
| *H01L 43/12* | (2006.01) |
| *H01L 43/08* | (2006.01) |
| *H01F 10/32* | (2006.01) |
| *H01F 41/34* | (2006.01) |
| *G11C 11/16* | (2006.01) |
| *H01L 27/22* | (2006.01) |
| *H01L 43/02* | (2006.01) |

(52) U.S. Cl.
CPC ............ *H01L 43/12* (2013.01); *G11C 11/161* (2013.01); *H01F 10/3254* (2013.01); *H01F 41/34* (2013.01); *H01L 27/222* (2013.01); *H01L 43/02* (2013.01); *H01L 43/08* (2013.01)

(58) Field of Classification Search
CPC ..... H01L 43/12; H01L 27/222; G11C 11/161; H01F 10/3254; H01F 41/34
See application file for complete search history.

(56) References Cited

U.S. PATENT DOCUMENTS

| | | |
|---|---|---|
| 7,352,021 B2 | 4/2008 | Bae et al. |
| 7,531,367 B2 | 5/2009 | Assefa et al. |
| 8,334,213 B2 | 12/2012 | Mao |
| 8,969,982 B2 | 3/2015 | Xiao et al. |
| 9,287,494 B1 | 3/2016 | Yan et al. |
| 9,666,792 B2 | 5/2017 | Chen et al. |

(Continued)

FOREIGN PATENT DOCUMENTS

KR  100975803 B1  8/2010

*Primary Examiner* — Mounir S Amer
*Assistant Examiner* — Alexander Belousov
(74) *Attorney, Agent, or Firm* — L. Jeffrey Kelly; Ryan, Mason & Lewis, LLP

(57) ABSTRACT

Methods for MTJ patterning for a MTJ device are provided. For example, a method includes (a) providing an MTJ device comprising a substrate comprising a plurality of bottom electrodes, a MTJ layer disposed on the substrate, and a plurality of pillars disposed on the MTJ layer and over the plurality of bottom electrodes, wherein the plurality of pillars comprise a metal layer and a hard mask layer disposed on the metal layer, (b) conducting a first ion beam etching of the MTJ device; (c) rotating the MTJ device by 90 degrees in a clockwise or a counter clockwise direction about an axis perpendicular to a top surface of the MTJ device from a starting position; (d) conducting a second ion beam etching of the MTJ device; and (e) repeating steps (c) and (d).

20 Claims, 4 Drawing Sheets

(56) References Cited

U.S. PATENT DOCUMENTS

| | | | |
|---|---|---|---|
| 2006/0014346 A1* | 1/2006 | Min | G11C 11/1659 |
| | | | 438/257 |
| 2013/0316536 A1 | 11/2013 | Seto et al. | |
| 2014/0084402 A1* | 3/2014 | Shimomura | G11C 11/161 |
| | | | 257/427 |
| 2014/0248718 A1 | 9/2014 | Kim et al. | |
| 2015/0255507 A1 | 9/2015 | Pakala et al. | |
| 2015/0263273 A1* | 9/2015 | Yoshikawa | H01L 43/08 |
| | | | 257/295 |
| 2016/0111472 A1 | 4/2016 | Do et al. | |

* cited by examiner

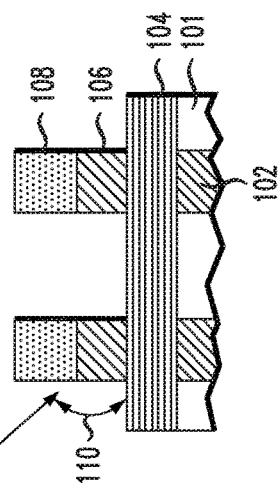
*FIG. 1*
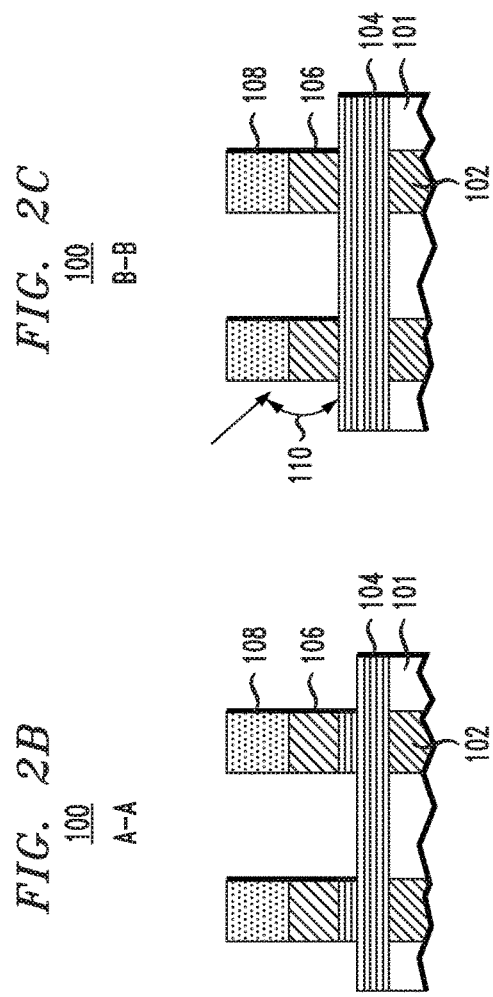
*FIG. 2B*
100
A-A
*FIG. 2C*
100
B-B
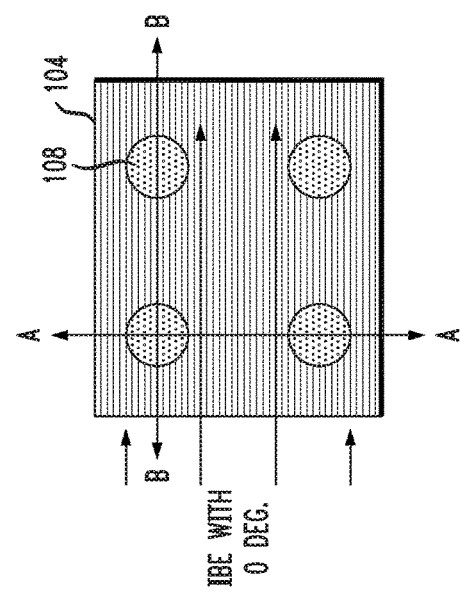
*FIG. 2A*
100

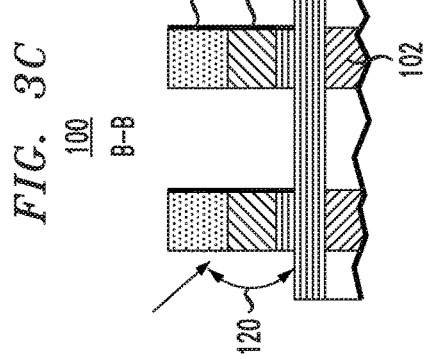
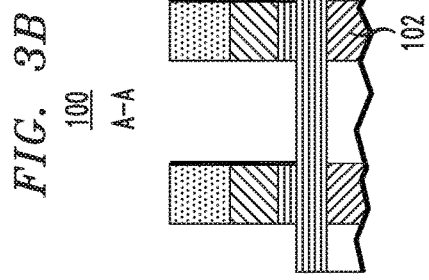
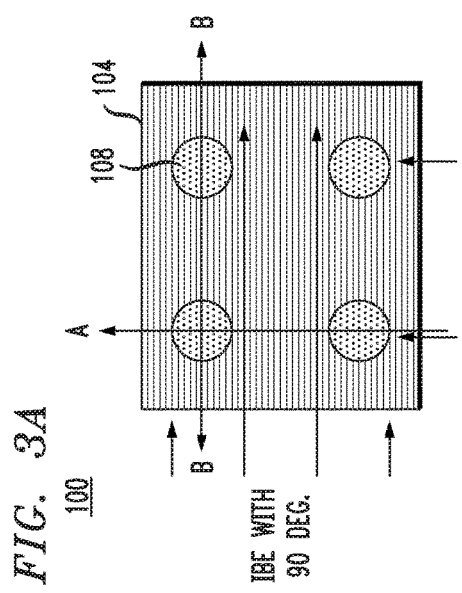
FIG. 3A  FIG. 3B  FIG. 3C
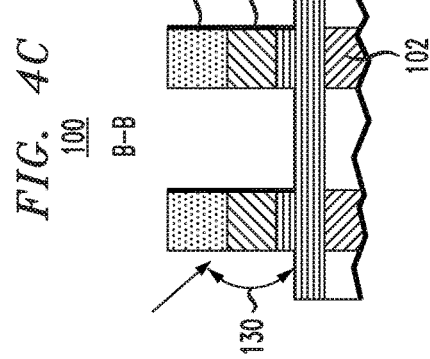
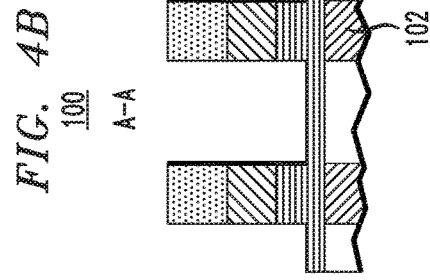
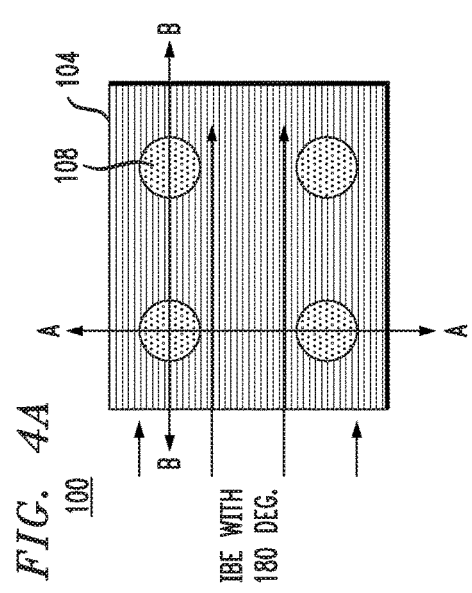
FIG. 4A  FIG. 4B  FIG. 4C

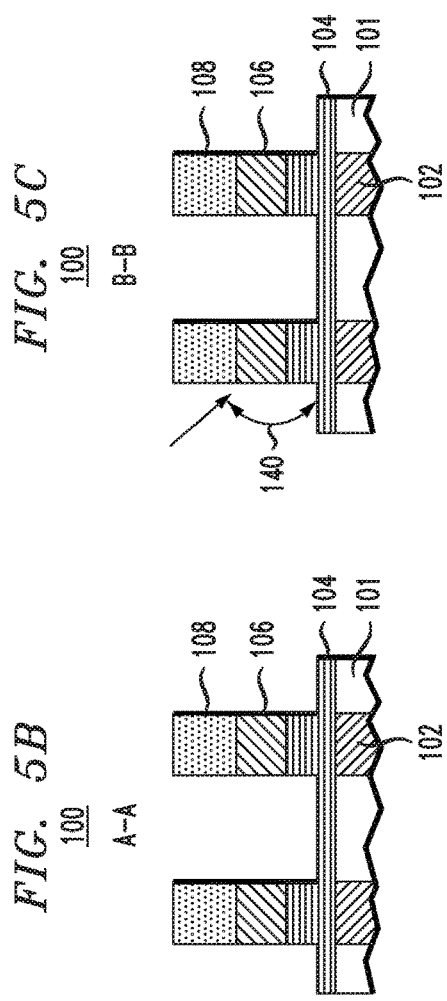
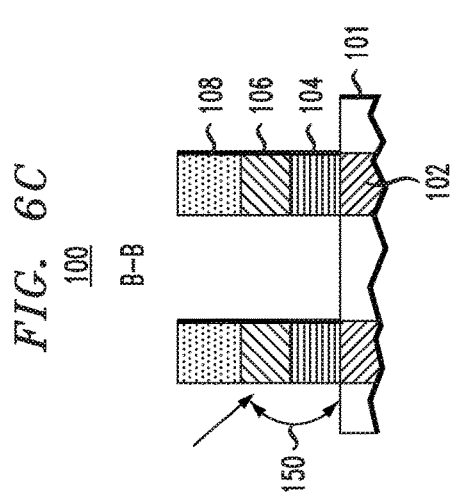

MTJ STACK ETCH USING IBE TO ACHIEVE VERTICAL PROFILE

BACKGROUND

This disclosure relates generally to magnetoelectronics, and more specifically, to a method for patterning magnetic tunnel junctions (MTJ).

MTJ patterning or etching processes are used to fabricate MTJs. Currently known methods for MTJ etching include ion beam etching (IBE) and chemical etching in a reactive ion etching (RIE). RIE process tends to cause sidewall damage on MTJ due to oxygen or corrosive chemicals and results in the degraded magnetic tunnel junction properties. An IBE process can avoid or reduce damage zones over RIE processes, but no chemical component is involved to improve etching selectivity. IBE involves directing a charged particle ion beam at a target material to etch the material. IBE is typically performed with a 30 to 50 degree angle with respect to the wafer surface with a fast and uniform rotation of the wafer. As MTJs become scaled down with tight pitch, such as in high-density MRAMs, IBE with uniform wafer rotation results in the shadowing of ion beam etching between pillars increase. It becomes very difficult to achieve vertical sidewall angle and remove the footings between pillars which result in the shorting between MTJ pillars. There is a growing demand to enhance etching efficiency of tight pitch pillars for technology extendibility.

SUMMARY

Embodiments of the invention include methods for magnetic tunnel junction (MTJ) patterning for magnetoresistive random access memory devices.

For example, one exemplary embodiment includes a method for MTJ patterning for a MTJ device, comprising:

(a) providing an MTJ device comprising a substrate comprising a plurality of bottom electrodes, a MTJ layer disposed on the substrate, and a plurality of pillars disposed on the MTJ layer and over the plurality of bottom electrodes, wherein the plurality of pillars comprise a metal layer and a hard mask layer disposed on the metal layer, (b) conducting a first ion beam etching of the MTJ device to remove a portion of a horizontal surface of the MTJ layer;

(c) rotating the MTJ device by 90 degrees in a clockwise or counter clockwise direction about an axis perpendicular to a top surface of the MTJ device from a starting position;

(d) conducting a second ion beam etching of the MTJ device to further remove the portion of the horizontal surface of the MTJ layer; and (e) repeating steps (c) and (d) until the horizontal surface of the MTJ layer is substantially removed.

These and other features, objects and advantages of the present invention will become apparent from the following detailed description of illustrative embodiment thereof, which is to be read in connection with the accompanying drawings.

BRIEF DESCRIPTION OF THE DRAWINGS

FIG. 1 depicts a cross-sectional view of a MTJ device after a typical IBE process.

FIG. 2A depicts a plan view of a starting MTJ device, in accordance with a first step an illustrative embodiment;

FIG. 2B depicts a cross-sectional view of the MTJ device, taken along the line A-A of FIG. 2A, in accordance with an illustrative embodiment;

FIG. 2C depicts a cross-sectional view of the MTJ device, taken along the line B-B of FIG. 2A, in accordance with an illustrative embodiment;

FIG. 3A depicts a plan view of a MTJ device, in accordance with another step in an illustrative embodiment;

FIG. 3B depicts a cross-sectional view of the MTJ device, taken along the line A-A of FIG. 3A, in accordance with an illustrative embodiment;

FIG. 3C depicts a cross-sectional view of the MTJ device, taken along the line B-B of FIG. 3A, in accordance with an illustrative embodiment;

FIG. 4A depicts a plan view of a MTJ device, in accordance with another step in an illustrative embodiment;

FIG. 4B depicts a cross-sectional view of the MTJ device, taken along the line A-A of FIG. 4A, in accordance with an illustrative embodiment;

FIG. 4C depicts a cross-sectional view of the MTJ device, taken along the line B-B of FIG. 4A, in accordance with an illustrative embodiment;

FIG. 5A depicts a plan view of a MTJ device, in accordance with another step in an illustrative embodiment;

FIG. 5B depicts a cross-sectional view of the MTJ device, taken along the line A-A of FIG. 5A, in accordance with an illustrative embodiment;

FIG. 5C depicts a cross-sectional view of the MTJ device, taken along the line B-B of FIG. 5A, in accordance with an illustrative embodiment;

FIG. 6A depicts a plan view of a MTJ device, in accordance with another step in an illustrative embodiment;

FIG. 6B depicts a cross-sectional view of the MTJ device, taken along the line A-A of FIG. 6A, in accordance with an illustrative embodiment;

FIG. 6C depicts a cross-sectional view of the MTJ device, taken along the line B-B of FIG. 6A, in accordance with an illustrative embodiment;

DETAILED DESCRIPTION

Figure 7A:
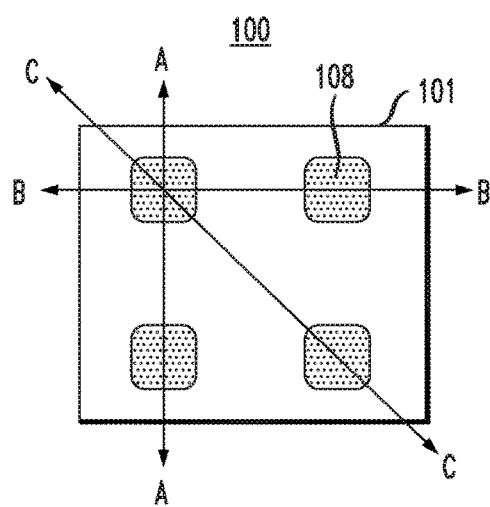
FIG. 7A depicts a plan view of a MTJ device, in accordance with another step an illustrative embodiment.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

As will be discussed below, a MJT device according to the present invention is rotated during the IBE process. Compared with a pure IBE or RIE process, use of the rotation described herein will ensure that the sidewall damage is removed during the IBE process. In other words, the present invention provides a method to obtain improved sidewall profiles. The sidewall profiles refer to the sides of the pillars of the patterned junctions or sides of MTJ pillars as shown in FIGS. 2A-7D. As can be seen from FIG. 1, MTJ device 12 includes the recess 15 of the bottom electrode 10 that cannot be avoided during a typical IBE or RIE process.

An illustrative embodiment for MTJ patterning for a MTJ device according to the present invention will be discussed below with reference to FIGS. 2A-7D using an IBE process to achieve a MTJ device with no chemically damaged sidewall. Referring now to the figures, FIG. 2A is a plan view of a starting MTJ device 100 for a first step of a method of the present invention, FIG. 2B is a cross-sectional view of the starting MTJ device 100, taken along the line A-A of FIG. 2A and FIG. 2C is a cross-sectional view of the starting MTJ device 100, taken along the line B-B of FIG. 2A. In this exemplary embodiment, the MTJ device 100 comprises a substrate 101 with a plurality of bottom electrodes or bit line contacts 102, a MTJ layer 104 disposed on substrate 101 including plurality of bottom electrodes/bit line contacts 102, and a plurality of pillars comprising metal layer 106 and hardmask layer 108 disposed on MTJ layer 104 and positioned above the plurality of bottom electrodes/bit line contacts 102. The bottom electrodes comprise a typical back-end-of line metal and/or bit line contact metal depending on the circuit design layout. In one embodiment, the bottom electrodes 102 include, for example, conducting but non-magnetic metal.

The MTJ layer 104 disposed on substrate 101 can be comprised of various layers in a stacked configuration. In one illustrative embodiment, MTJ layer 104 can include a plurality of magnetic thin films with a tunnel barrier. In an embodiment of the present invention, a MTJ with an oxide tunnel barrier is used. In general, the plurality of magnetic thin films include, for example, cobalt, iron, nickel, cobalt alloy, iron alloy, nickel alloy, nitrides and oxides, e.g., Fe, CoFe, CoFeB, etc. A tunnel barrier includes, for example, tantalum, titanium, ruthenium, magnesium, aluminum, copper, tantalum alloy, titanium alloy, ruthenium alloy, magnesium alloy, aluminum alloy, copper alloy, and nitrides and oxides, e.g., MgO. In one illustrative embodiment, MTJ layer 104 can include a bottom electrode layer, a seed layer, a bottom fixed magnetic layer, a thin dielectric tunnel barrier and a free top magnetic layer in a stacked configuration.

Hard mask metal pillars are formed on MTJ layer 104 by methods known in the art. For example, a metal layer 106 can first be disposed on MTJ layer 104 followed by a hard mask 108 being disposed on the metal layer 106. Next, the hard mask can be patterned using a mask template to form the pillars of metal layers 106 and hard mask 108. The hard mask metal pillars form a template to etch the MTJ layer 104 into MTJ pillars as described below. Metal layers 106 can be formed of a non-magnetic metallic material such as, for example, tantalum nitride and titanium nitride. Hard mask 108 can be formed of any known hard mask material such as, for example, silicon nitride and silicon dioxide. The hard mask metal pillars are disposed on substrate 101 such that they are position above the plurality of bottom electrodes/bit line contacts 102. Now, the IBE process according to an embodiment is performed.

First as shown in FIG. 2A, an IBE process is performed where the MTJ device 100 is maintained at its starting position, i.e., at 0 degrees of MTJ device 100. In FIG. 2A, the ion beam is entering from a 0 degree orientation of the pillar array from top down view. The starting point of 0 degree is determined after deciding the 90 degree orientation. Typically, MTJ pillars in a unit cell are residing at four corners of the substrate in a rectangle or square shape. MTJ arrays are a repeating pattern of the unit cell. An MTJ unit cell can be in, for example, a diamond shape. The starting point of the IBE direction is any orientation to maximize the ion beam etching and minimize the shadowing of etching. Ion beam etching is typically performed at a tilt angle with respect to the substrate's surface. In one embodiment, as shown in FIG. 2C, the IBE process is performed where the ion beam is directed at a tilt angle 110 relative to substrate's surface. In one embodiment, an IBE angle with respect to the substrate's surface is from about 10 to about 80 degrees or from about 30 to about 50 degrees depending on, for example, the size, height, and spacing between pillars. In one embodiment, an acceptable etch rate for manufacturing ranges from about 0.1 to about 10 A/s. As one skilled in the art will understand, the MTJ stack height will determine the total etching time.

Referring now to FIGS. 3A-3C, FIG. 3A is a plan view of a MTJ device 100 for another step of a method of the present invention, FIG. 3B is a cross-sectional view of the starting MTJ device 100, taken along the line A-A of FIG. 3A and FIG. 3C is a cross-sectional view of the starting MTJ device 100, taken along the line B-B of FIG. 3A. In general, the next step in the method according to the present invention involves rotating MTJ device 100 by 90 degrees in a clockwise or a counter clockwise direction about an axis perpendicular to a top surface of MTJ device 100 from the starting position. In accordance with the figures and the description herein, MTJ device 100 is shown being rotated by 90 degrees in a clockwise direction about an axis perpendicular to a top surface of MTJ device 100 from the starting position.

Accordingly, as shown in FIG. 3A, MTJ device 100 is rotated by 90 degrees in a clockwise direction about an axis perpendicular to a top surface of MTJ device 100 from the starting position. Next, as shown in FIG. 3C, the IBE process in this step is performed where the ion beam is directed at the tilted angle 120 relative to substrate's surface of MTJ device 100. This angle dependence of the IBE results in further removal of the horizontal surfaces of the MTJ layer 104 from the MTJ device 100 as compared to the vertical sidewalls thereby lengthening the vertical sidewalls in MTJ layer 104 which are coextensive with sidewalls for metal layer 106 and hard mask 108, as shown in FIGS. 3B and 3C. In one embodiment, an IBE angle with respect to the substrate's surface is from about 10 to about 80 degrees or from about 30 to about 50 degrees depending on, for example, the size, height, and spacing between pillars. In one embodiment, an acceptable etch rate for manufacturing ranges from about 0.1 to about 10 A/s. As one skilled in the art will understand, the MTJ stack height will determine the total etching time.

As one skilled in the art will understand, one or more steps will be carried out as described below in which MTJ device 100 will be further rotated an additional 90 degrees in the clockwise or counter clockwise direction about an axis perpendicular to the top surface of MTJ device 100 as determined from the previous step and then subjected to the IBE process until the horizontal surfaces of the MTJ layer 104 are substantially removed from the MTJ device 100 thereby providing a plurality of pillars in square shape of MTJ layers 104 and metal layers 106 having a vertical profile of sidewalls 100 (see FIG. 6A-6C) with little to no shadowing.

Referring now to FIGS. 4A-4C, FIG. 4A is a plan view of a MTJ device 100 for another step of a method of the present invention, FIG. 4B is a cross-sectional view of the starting MTJ device 100, taken along the line A-A of FIG. 4A and FIG. 4C is a cross-sectional view of the starting MTJ device 100, taken along the line B-B of FIG. 4A. As shown in FIG. 4A, MTJ device 100 is rotated by another 90 degrees in a clockwise direction about an axis perpendicular to a top surface of MTJ device 100 from the previous step, i.e., MTJ device 100 is rotated by 180 degrees in a clockwise direction about an axis perpendicular to a top surface of MTJ device 100 from the previous position. Next, as shown in FIG. 4C, the IBE process in this step is performed where the ion beam is directed at the tilted angle 130 relative to substrate's surface of MTJ device 100. This angle dependence of the IBE results in further removal of the horizontal surfaces of the MTJ layer 104 from the MTJ device 100 thereby lengthening the vertical sidewalls in MTJ layer 104 which are coextensive with sidewalls for metal layer 106 and hard mask 108, as shown in FIGS. 4B and 4C. In one embodiment, an IBE angle with respect to the substrate's surface is from about 10 to about 80 degrees or from about 30 to about 50 degrees depending on, for example, the size, height, and spacing between pillars. In one embodiment, an acceptable etch rate for manufacturing ranges from about 0.1 to about 10 A/s. As one skilled in the art will understand, the MTJ stack height will determine the total etching time.

Referring now to FIGS. 5A-5C, FIG. 5A is a plan view of a MTJ device 100 for another step of a method of the present invention, FIG. 5B is a cross-sectional view of the starting MTJ device 100, taken along the line A-A of FIG. 5A and FIG. 5C is a cross-sectional view of the starting MTJ device 100, taken along the line B-B of FIG. 5A. As shown in FIG. 5A, MTJ device 100 is rotated by another 90 degrees in a clockwise direction about an axis perpendicular to a top surface of MTJ device 100 from the previous step, i.e., MTJ device 100 is rotated by 270 degrees in a clockwise direction about an axis perpendicular to a top surface of MTJ device 100 from the previous position. Next, as shown in FIG. 5C, the IBE process in this step is performed where the ion beam is directed at the tilted angle 140 relative to substrate's surface of MTJ device 100. This angle dependence of the IBE results in further removal of the horizontal surfaces of the MTJ layer 104 from the MTJ device 100 thereby lengthening the vertical sidewalls in MTJ layer 104 which are coextensive with sidewalls for metal layer 106 and hard mask 108, as shown in FIGS. 5B and 5C. In one embodiment, an IBE angle with respect to the substrate's surface is from about 10 to about 80 degrees or from about 30 to about 50 degrees depending on, for example, the size, height, and spacing between pillars. In one embodiment, an acceptable etch rate for manufacturing ranges from about 0.1 to about 10 A/s. As one skilled in the art will understand, the MTJ stack height will determine the total etching time.

Referring now to FIGS. 6A-6C, FIG. 6A is a plan view of a MTJ device 100 for another step of a method of the present invention, FIG. 6B is a cross-sectional view of the starting MTJ device 100, taken along the line A-A of FIG. 6A and FIG. 6C is a cross-sectional view of the starting MTJ device 100, taken along the line B-B of FIG. 6A. As shown in FIG. 6A, MTJ device 100 is rotated by another 90 degrees in a clockwise direction about an axis perpendicular to a top surface of MTJ device 100 from the previous step, i.e., MTJ device 100 is rotated by 360 degrees in a clockwise direction about an axis perpendicular to a top surface of MTJ device 100 from the previous position. Next, as shown in FIG. 6C, the IBE process in this step is performed where the ion beam is directed at the tilted angle 150 relative to substrate's surface of MTJ device 100. This angle dependence of the IBE results in further removal of the horizontal surfaces of the MTJ layer 104 from the MTJ device 100 thereby lengthening the vertical sidewalls in MTJ layer 104 which are coextensive with sidewalls for metal layer 106 and hard mask 108, as shown in FIGS. 6B and 6C. In one embodiment, an IBE angle with respect to the substrate's surface is from about 10 to about 80 degrees or from about 30 to about 50 degrees depending on, for example, the size, height, and spacing between pillars. In one embodiment, an acceptable etch rate for manufacturing ranges from about 0.1 to about 10 A/s. As one skilled in the art will understand, the MTJ stack height will determine the total etching time.

Figure 7B:
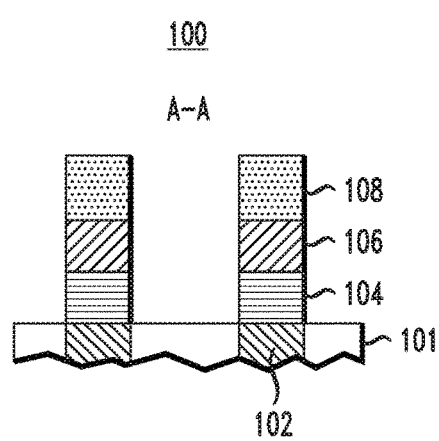
FIG. 7B depicts a cross-sectional view of the MTJ device, taken along the line A-A of FIG. 7A, in accordance with an illustrative embodiment.
Figure 7C:
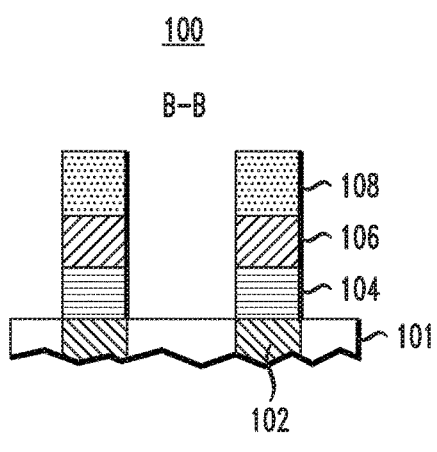
FIG. 7C depicts a cross-sectional view of the MTJ device, taken along the line B-B of FIG. 7A, in accordance with an illustrative embodiment.
Figure 7D:
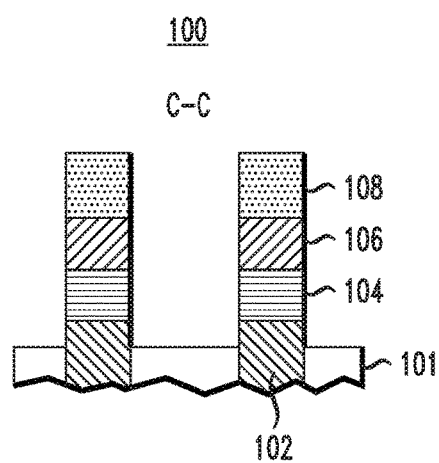
FIG. 7D depicts a cross-sectional view of the MTJ device, taken along the line C-C of FIG. 7A, in accordance with an illustrative embodiment.

Referring now to FIGS. 7A-7D, FIG. 7A is a plan view of a MTJ device 100 for another step of a method of the present invention, FIG. 7B is a cross-sectional view of the starting MTJ device 100, taken along the line A-A of FIG. 7A, FIG. 7C is a cross-sectional view of the starting MTJ device 100, taken along the line B-B of FIG. 7A, and FIG. 7D is a cross-sectional view of the starting MTJ device 100, taken along the line C-C of FIG. 7A. In one embodiment, as shown in FIG. 7A, once the IBE process is completed, the pillars of MTJ layer 104, metal layer 106 and hard mask 108 are formed from a circular shape into a square shape as compared to the starting pillars of metal layer 106 and hard mask 108 which are in a circular shape (see FIGS. 2A-2C). FIG. 7C illustrates that a recess is formed in the diagonal direction of substrate 102 after completion of the process due to redundant etching in these areas. If desired, one or more additional touch-up IBE with a quick rotational IBE mode can be carried out to smooth these shapes.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for MTJ patterning for a MTJ device, comprising:
   (a) providing an MTJ device comprising a substrate comprising a plurality of bottom electrodes, a MTJ layer disposed on the substrate, and a plurality of pillars disposed on the MTJ layer and over the plurality of bottom electrodes, wherein the plurality of pillars comprise a metal layer and a hard mask layer disposed on the metal layer,
   (b) conducting a first ion beam etching of the MTJ device to remove a portion of a horizontal surface of the MTJ layer;
   (c) stopping the first ion beam etching and rotating the MTJ device by 90 degrees in a clockwise or a counter clockwise direction about an axis perpendicular to a top surface of the MTJ device from a starting position;
   (d) stopping rotating the MTJ device and conducting a second ion beam etching of the MTJ device to further remove the portion of the horizontal surface of the MTJ layer; and
   (e) repeating steps (c) and (d) until the horizontal surface of the MTJ layer is substantially removed.

2. The method of claim 1, wherein the MTJ layer comprises a plurality of magnetic thin films with a tunnel barrier.

3. The method of claim 1, wherein the MTJ layer comprises a bottom electrode layer disposed on a bit line contact metal, a seed layer, a bottom fixed magnetic layer, a thin dielectric tunnel barrier and a free top magnetic layer in a stacked configuration.

4. The method of claim 3, wherein the metal layer comprises one of tantalum nitride and titanium nitride.

5. The method of claim 1, wherein the hard mask comprises one of silicon nitride and silicon dioxide.

6. The method of claim 1, wherein the first ion beam etching is carried out at an etch rate of from about 0.1 to about 10 A/s.

7. The method of claim 1, wherein the second ion beam etching is carried out at an etch rate of from about 0.1 to about 1 OA/s.

8. The method of claim 1, wherein the first and second ion beam etchings are independently carried out at a tilt angle relative to the top surface of the MTJ device of from about 10 to about 80 degrees.

9. The method of claim 1, wherein the repeating step (e) comprises:
   (e) stopping the second ion beam etching and rotating the MTJ device by 90 degrees in a clockwise or a counter clockwise direction about the axis perpendicular to the top surface of the MTJ device from the position in step (c); and
   (f) stopping rotating the MTJ device and conducting a third ion beam etching of the MTJ device to further remove the portion of the horizontal surface of the MTJ layer.

10. The method of claim 9, wherein the third ion beam etching is carried out at a tilt angle relative to the top surface of the MTJ device of from about 10 to about 80 degrees, and an etch rate of from about 0.1 to about 10 A/s.

11. The method of claim 9, further comprising:
   (g) stopping the third ion beam etching and rotating the MTJ device by 90 degrees in a clockwise or a counter clockwise direction about the axis perpendicular to the top surface of the MTJ device from the position in step (e); and
   (h) stopping rotating the MTJ device and conducting a fourth ion beam etching of the MTJ device to further remove the portion of the horizontal surface of the MTJ layer.

12. The method of claim 11, wherein the fourth ion beam etching is carried out at a tilt angle relative to the top surface of the MTJ device of from about 10 to about 80 degrees, and an etch rate of from about 0.1 to about 10 A/s.

13. The method of claim 11, further comprising:
   (i) stopping the fourth ion beam etching and rotating the MTJ device by 90 degrees in a clockwise or a counter clockwise direction about the axis perpendicular to the top surface of the MTJ device from the position in step (g); and
   (j) stopping rotating the MTJ device and conducting a fifth ion beam etching of the MTJ device to further remove the portion of the horizontal surface of the MTJ layer.

14. The method of claim 13, wherein the fifth ion beam etching is carried out at a tilt angle relative to the top surface of the MTJ device of from about 10 to about 80 degrees, and an etch rate of from about 0.1 to about 10 A/s.

15. A method for MTJ patterning for a MTJ device, comprising:
   (a) forming an MTJ device comprising a bottom electrode substrate, a MTJ layer disposed on the bottom electrode, and a plurality of pillars disposed on the MTJ layer, wherein the MTJ layer comprises a plurality of magnetic thin films with a tunnel barrier and further wherein the plurality of pillars comprise a metal layer and a hard mask layer disposed on the metal layer;
   (b) conducting a first ion beam etching of the MTJ device at a tilt angle relative to a top surface of the MTJ device of from about 10 to about 80 degrees to remove a portion of a horizontal surface of the MTJ layer;
   (c) stopping the first ion beam etching and rotating the MTJ device by 90 degrees in a clockwise or a counter clockwise direction about an axis perpendicular to a top surface of the MTJ device from a starting position;
   (d) stopping rotating the MTJ device and conducting a second ion beam etching of the MTJ device at a tilt angle relative to a top surface of the MTJ device of from about 10 to about 80 degrees to further remove the portion of the horizontal surface of the MTJ layer; and (e) repeating steps (c) and (d) until the horizontal surface of the MTJ layer is substantially removed.

16. The method of claim 15, wherein the metal layer comprises one of tantalum nitride and titanium nitride.

17. The method of claim 16, wherein the hard mask comprises one of silicon nitride and silicon dioxide.

18. The method of claim 15, wherein the repeating step (e) comprises:

(e) stopping the second ion beam etching and rotating the MTJ device by 90 degrees in a clockwise or a counter clockwise direction about the axis perpendicular to the top surface of the MTJ device from the position in step (c); and (f) stopping rotating the MTJ device and conducting a third ion beam etching of the MTJ device at a tilt angle relative to a top surface of the MTJ device of from about 10 to about 80 degrees to further remove the portion of the horizontal surface of the MTJ layer.

19. The method of claim 18, further comprising:

(g) stopping the third ion beam etching and rotating the MTJ device by 90 degrees in a clockwise or a counter clockwise direction about the axis perpendicular to the top surface of the MTJ device from the position in step (e); and (h) stopping rotating the MTJ device and conducting a fourth ion beam etching of the MTJ device at a tilt angle relative to a top surface of the MTJ device of from about 10 to about 80 degrees to further remove the portion of the horizontal surface of the MTJ layer.

20. The method of claim 19, further comprising:

(i) stopping the fourth ion beam etching and rotating the MTJ device by 90 degrees in a clockwise or a counter clockwise direction about the axis perpendicular to the top surface of the MTJ device from the position in step (g); and (j) stopping rotating the MTJ device and conducting a fifth ion beam etching of the MTJ device at a tilt angle relative to a top surface of the MTJ device of from about 10 to about 80 degrees to further remove the portion of the horizontal surface of the MTJ layer.

* * * * *